(12) United States Patent
Amelifard et al.

(10) Patent No.: US 9,356,614 B1
(45) Date of Patent: May 31, 2016

(54) THERMOMETER CODE CONVERTER

(71) Applicant: QUALCOMM Incorporated, San Diego, CA (US)

(72) Inventors: Behnam Amelifard, San Diego, CA (US); Hadi Goudarzi, San Diego, CA (US); Chia Heng Chang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/604,616

(22) Filed: Jan. 23, 2015

(51) Int. Cl.
*H03M 7/16* (2006.01)
*H03M 1/10* (2006.01)
*H03M 1/00* (2006.01)
*G11C 19/28* (2006.01)

(52) U.S. Cl.
CPC ............. *H03M 1/1009* (2013.01); *G11C 19/28* (2013.01); *H03M 1/002* (2013.01); *H03M 7/165* (2013.01)

(58) Field of Classification Search
CPC ..... H03M 1/1009; H03M 7/165; G11C 19/28
USPC ........................................................ 341/155
See application file for complete search history.

(56) References Cited

U.S. PATENT DOCUMENTS

| | | | |
|---|---|---|---|
| 4,935,741 A | 6/1990 | Reich | |
| 6,344,812 B1 | 2/2002 | Takeda et al. | |
| 6,665,692 B1 * | 12/2003 | Nieminen | G06F 7/584 375/E1.014 |
| 6,781,435 B1 * | 8/2004 | Gupta | H03K 19/1954 327/403 |
| 6,857,043 B1 * | 2/2005 | Lee | G06F 5/14 341/98 |
| 7,352,297 B1 | 4/2008 | Rylyakov et al. | |
| 7,642,938 B2 | 1/2010 | Simpson | |
| 7,675,440 B1 | 3/2010 | Xiao et al. | |
| 2005/0219077 A1 | 10/2005 | Zhang | |
| 2014/0232583 A1 | 8/2014 | Pettit | |

OTHER PUBLICATIONS

International Search Report and Written Opinion—PCT/US2015/068183—ISA/EPO—Mar. 30, 2016.

\* cited by examiner

*Primary Examiner* — Brian Young
(74) *Attorney, Agent, or Firm* — Arent Fox LLP

(57) ABSTRACT

A code converter is provided. The code converter includes a plurality of serial shift registers arranged to convert an input to a thermometer output. The code converter further includes a plurality of clock control circuits each configured to provide a clock to a corresponding one of the shift registers. A method of generating a signal in thermometer code is provided. The method includes enabling a subset of a plurality of shift registers and converting an input to a thermometer output by the plurality of shift registers. Another code converter is further provided. The code converter includes means for converting an input to a thermometer output. The means for converting includes a plurality of shift registers. The code converter further includes means for enabling a subset of the shift registers.

20 Claims, 9 Drawing Sheets

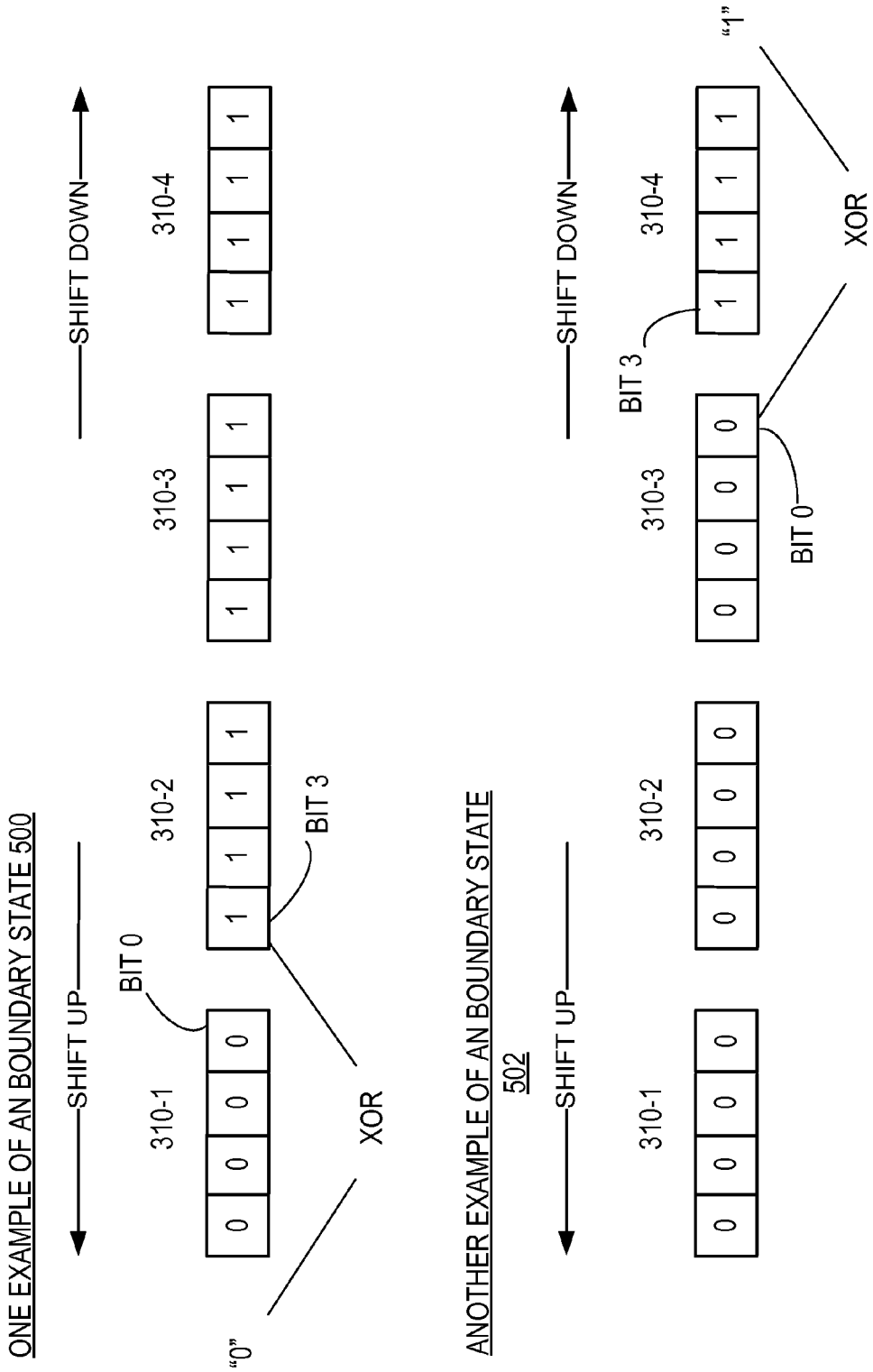

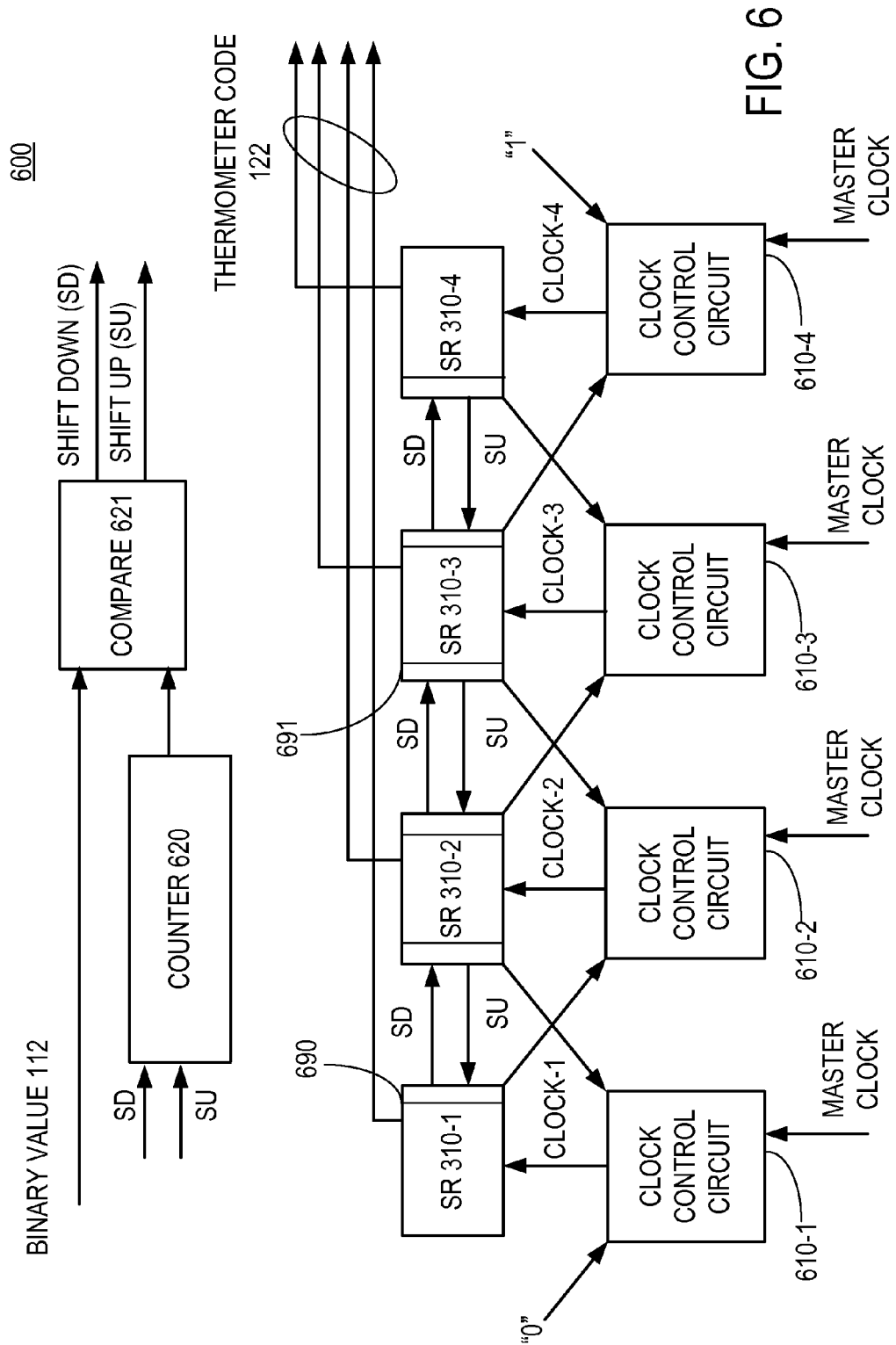

THERMOMETER CODE CONVERTER

BACKGROUND

1. Field

The disclosure relates to methods and apparatuses with thermometer code converter function and, in particular, to electronic apparatuses and integrated circuits (ICs) with a low-power thermometer code converter.

2. Background

Increasingly, power management is becoming an issue in operating ICs. For example, wireless communication technologies and devices (e.g., cellular phones, tablets, laptops, etc.) have grown in popularity and uses over the past several years. These electronic apparatuses have grown in complexity and now commonly include multiple processors (e.g., baseband processor and application processor) and other resources that allow the users to execute complex and power intensive software applications (e.g., music players, web browsers, video streaming applications, etc.). To meet the increasing performance demand, the processors have increased in complexity and operating frequencies. As a result, substantial power is consumed while operating the processors.

The power consumption impacts the battery life of a cell phone. The heat generated by power consumption may affect the performance and reliability of the device. For example, the performance of an IC degrades when operating in high temperature. Thus, one design challenge is to manage the power-consumption issue in, for example, the aforementioned devices.

SUMMARY

Aspects of a method of generating a signal in thermometer code are disclosed. The method includes enabling a subset of a plurality of shift registers and converting an input to a thermometer output by the plurality of shift registers.

Aspects of a code converter are disclosed. The code converter includes a plurality of serial shift registers arranged to convert an input to a thermometer output. The code converter further includes a plurality of clock control circuits each configured to provide a clock to a corresponding one of the shift registers.

Aspects of another code converter are disclosed. The code converter includes means for converting an input to a thermometer output. The means for converting includes a plurality of shift registers. The code converter further includes means for enabling a subset of the shift registers.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other aspects. Accordingly, the drawings and detailed description are to be regarded as illustrative in nature and not as restrictive.

BRIEF DESCRIPTION OF THE DRAWINGS

FIG. 5 is a conceptual representation of diagrams illustrating further states of an exemplary embodiment of a thermometer code converter.

FIG. 6 is a block diagram of an implementation of an exemplary embodiment of a thermometer code converter.

DETAILED DESCRIPTION

Figure 1:
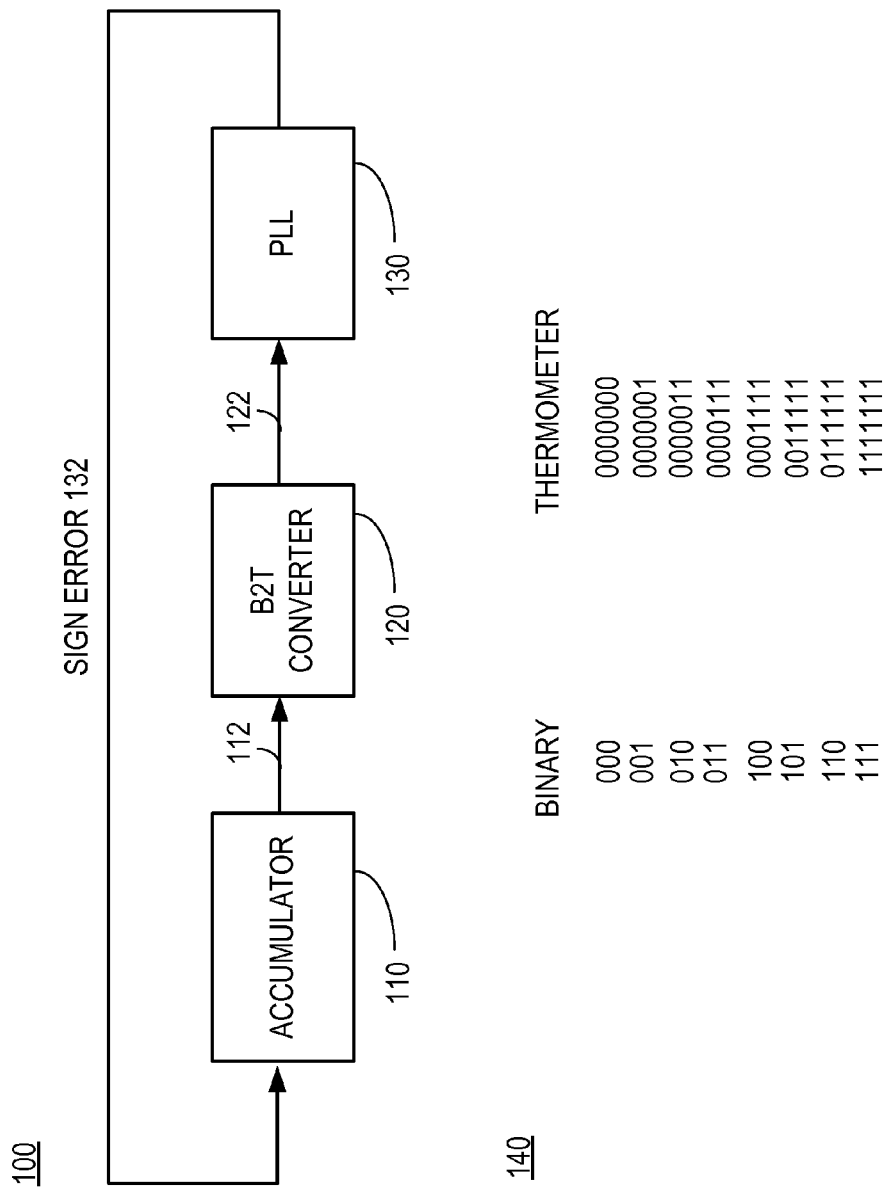
FIG. 1 is a diagram of an analog circuit calibration system utilizing an exemplary embodiment of a thermometer code converter.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The term "apparatus" shall be construed to include any integrated circuit or system, or any portion of an integrated circuit or system (e.g., blocks, modules, components, circuits, elements, or the like). By way of example, the term "apparatus" may be used to refer to a processor or any portion of a processor (e.g., a combined application processor and baseband processor for a mobile device). Apparatus may be, for example, integrated circuit, system-on-chip, or a processor in a cell phone. The term "apparatus" shall also be construed to include any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, or the like). The term "method" shall similarly be construed to include the operation of any integrated circuit or system, or any portion of an integrated circuit or system, or any intermediate product or end product, or any step, process, algorithm, or the like, or any combination thereof performed by such integrated circuit or system (or portion thereof), intermediate product, or end product.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims. For example, the steps may be implemented by logic gates to perform the functions described herein, processor(s) performing those functions, circuits generating the signals for the functions described herein, or combinations thereof The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element. A reference to a signal may be referred to the underlying signal line (e.g., a metal line on an IC) carrying the signal.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof. Moreover, as used herein, any reference to a signal may refer to the underlying conductor configured to carry the signal.

Various aspects of apparatuses and methods for a thermometer converter function are presented with respect to a processor for wireless communication. However, as those skilled in the art will readily appreciate, aspects and applications of the disclosure may not be limited thereto. For example, the features presented may be applicable to other ICs besides a processor and applicable to functions beyond wireless communication. Accordingly, all references to a specific application for the presented apparatus or method are intended only to illustrate exemplary aspects of the apparatus or method with the understanding that such aspects may have a wide differential of applications.

FIG. 1 is a diagram of an analog circuit calibration system 100 utilizing an exemplary embodiment of a thermometer code converter. An exemplary embodiment apparatus may be circuits, ICs, or processors that incorporate the binary-to-thermometer code converter 120. The exemplary embodiment apparatus may further be an intermediate product (e.g., a board) that incorporates the circuits, ICs, or processors or an end product (e.g., cell phones, tablets, laptop computers, etc.) that incorporates the circuits, ICs, or processors. An exemplary embodiment apparatus may be a cell phone incorporating the processor that includes the analog circuit calibration system 100. Another embodiment apparatus may include the binary-to-thermometer code converter 120. Increasingly, analog systems in a processor, such as the phase-locked loop (PLL) 130, are calibrated using digital circuits. Such digital calibration system may be easier to design because calculations performed in the digital domain are usually not affected by process, voltage, or temperature variations.

The analog circuit calibration system 100 includes a PLL 130, an accumulator 110, and a binary-to-thermometer code converter 120. The PLL 130 is an example of an analog circuit calibrated digitally. Such analog circuit may not be limited to PLLs as would be understood by a person or ordinary skill in the art. The PLL 130 compares its oscillating output with a reference signal internally and outputs a sign error signal 132. The signal error signal is used in a feedback loop to calibrate the PLL 130 by adjusting an attribute (e.g., a bias voltage controlling the frequency of the PLL 130) in accordance with knowledge in the art. The accumulator 110 receives the sign error signal 132 and adds to or subtracts from a stored value accordingly to adjust a binary value. In an exemplary embodiment, the accumulator 110 may provide the adjusted binary value 112 to the binary-to-thermometer code converter 120. The binary-to-thermometer code converter 120 may, for example, include a binary-to-thermometer code converter encoder. The binary-to-thermometer code converter 120 converts the adjusted binary value 112 to a thermometer code output 122. For example, the conversion may be based on table 140 stored in a memory (which may be part of the B2T converter 120). One characteristic of the thermometer code is that only one bit changes at a time (e.g., in a cycle). In this fashion, the PLL 130 may adjust the attribute (e.g., the bias voltage controlling the frequency of the PLL 130) incrementally in a step-wise fashion to reach an equilibrium point.

Figure 2:
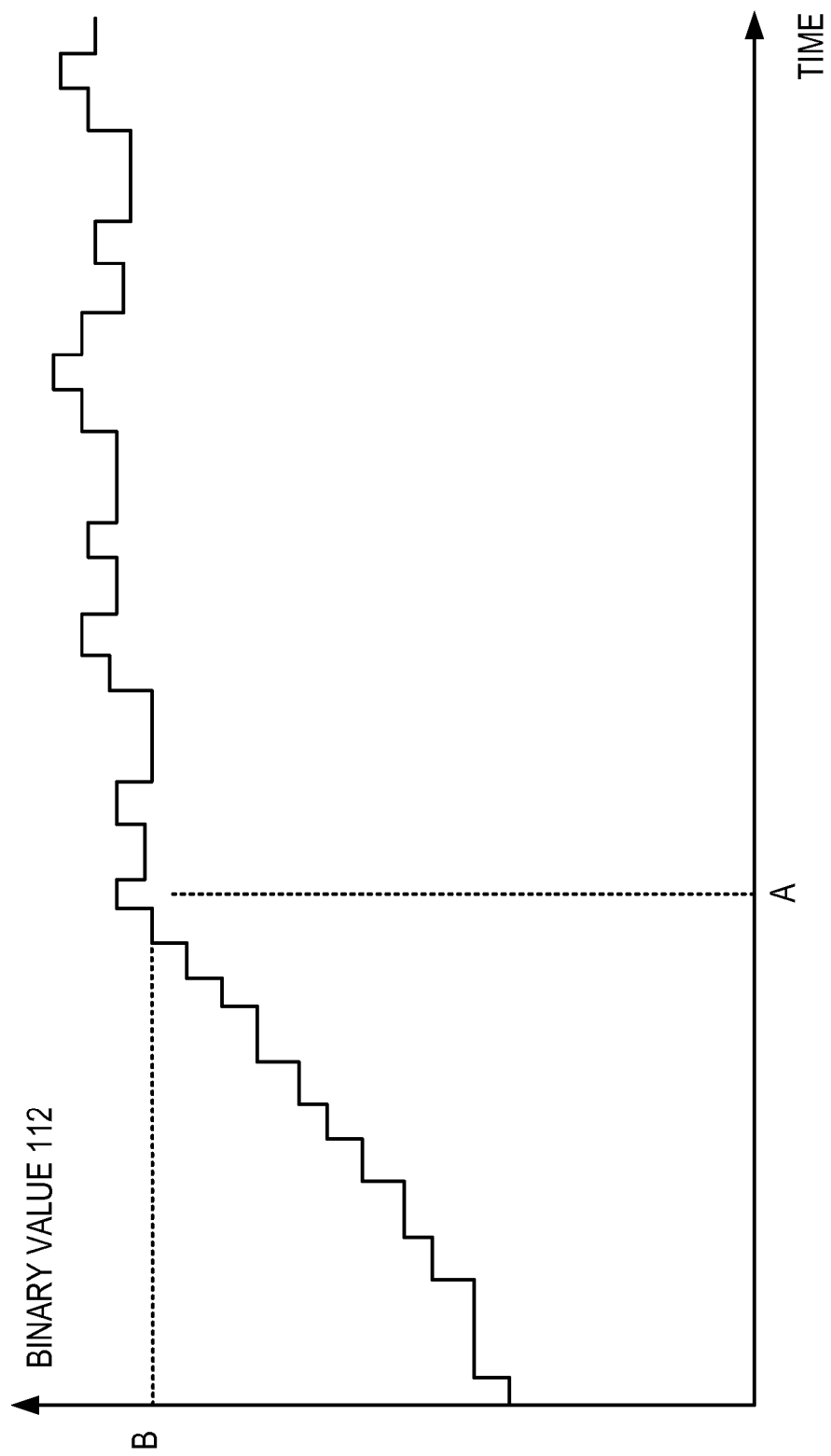
FIG. 2 is a diagram of an example of the binary value adjusted over time.

FIG. 2 is a diagram of an example of the binary value 112 adjusted over time. As illustrated, the binary value 112 is adjusted step-wise incrementally. Before A, the calibrated attribute of the PLL 130 may initiate (e.g., rise) quickly. At A, an equilibrium point B is reached, and the binary value 112 may oscillate slowly around the equilibrium point B.

In one example, the binary-to-thermometer code converter 120 may be implemented with a serial shift register (SR) configured to shift-up and shift-down (e.g., a serial-in, serial out SR). For example, an M-bit SR may be utilized for outputting an M-bit thermometer code. In an exemplary embodiment, a processor may include multiple thermometer code converters, and the size of M may be a relatively large number. In these cases, the multiple thermometer code converters may be configured in various ways to reduce the standby currents consumed. In an exemplary embodiment, a thermometer code converter may be implemented with multiple serial SRs. A subset (e.g., less than all) of the multiple serial SRs may be turned off to save power. Such scheme may achieve the desirable goal of reducing the power consumption of the thermometer code converters.

Figure 3:
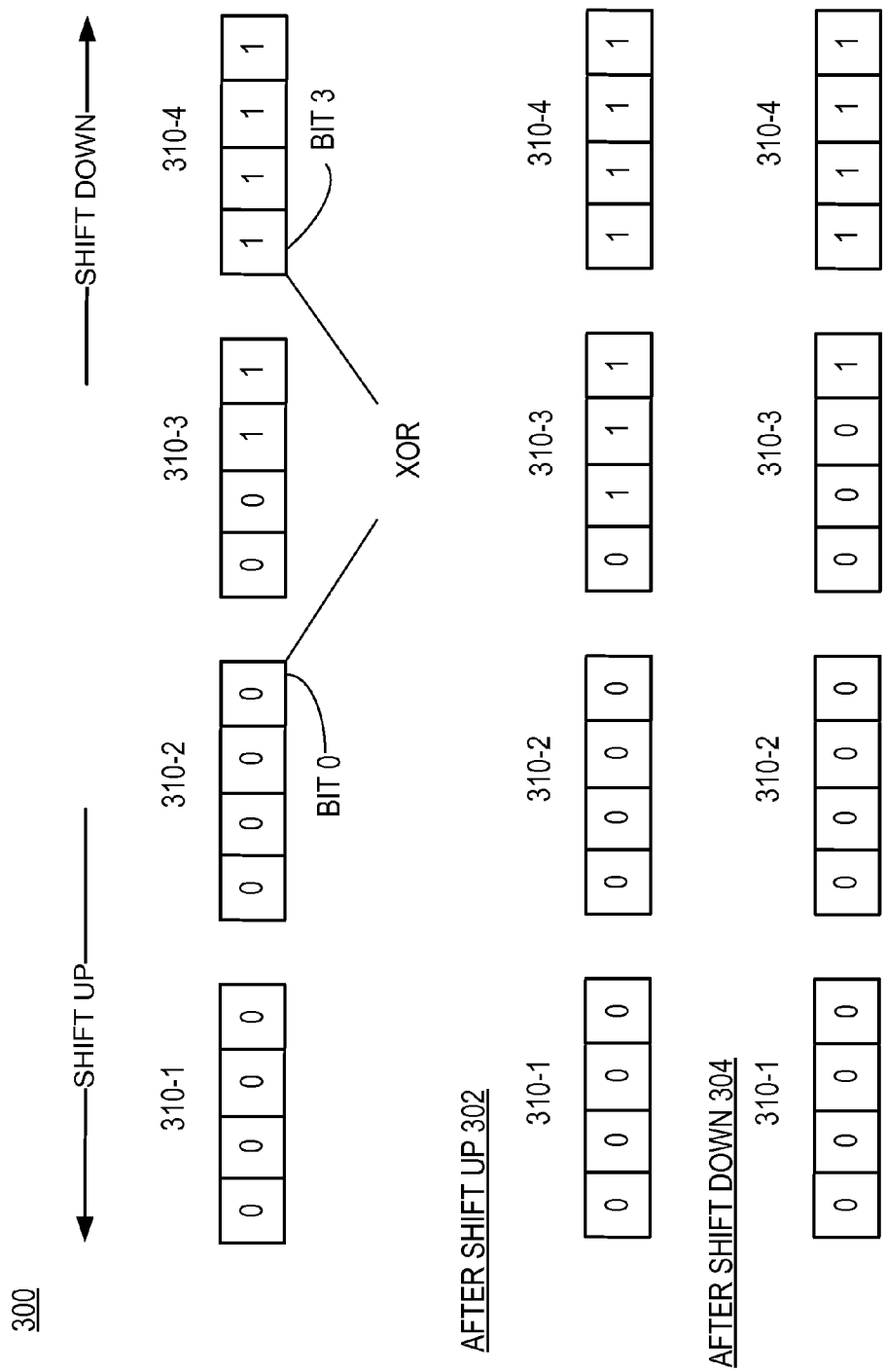
FIG. 3 is a conceptual representation of diagrams illustrating certain states of an exemplary embodiment of a thermometer code converter.

FIG. 3 is a conceptual representation of diagrams 300, 302, and 304 illustrating certain states of an exemplary embodiment of a thermometer code converter. The thermometer code converter includes four serial SRs (310-1, 310-2, 310-3, 310-4) of 4 bits each arranged in series. The serial SRs (310-1, 310-2, 310-3, 310-4) provide the means to convert, for example, a binary input to a thermometer output. Each of the serial SRs (310-1, 310-2, 310-3, 310-4) may be configured to selectively shift up and shift down in response to the binary value input 112. For example, the serial SR 310-4 shifts up to the serial SR 310-3; the serial SR 310-3 shifts up to the serial SR 310-2; and so forth. The serial SR 310-1 shifts down to the serial SR 310-2; the serial SR 310-2 shifts down to the serial SR 310-3; and so forth. Diagram 302 illustrates the state of the thermometer code converter after shifting up from diagram 300. Diagram 304 illustrates the state of the thermometer code converter after shifting down from diagram 300. As shown, the states of the serial SRs 310-1, 310-2, and 310-4 are unchanged by a shift from the states of diagram 300.

The state of the serial SR 310-3 may change due to a shift, and therefore, the serial SR 310-3 may be enabled for a shift in a current cycle. The states of the serial SRs 310-1, 310-2, and 310-4 will not change in the current cycle, and therefore, these serial SRs may be deactivated or disabled to reduce power consumption. The condition to enable the serial SR 310-3 may be based on the states that an adjacent bit of a serial SR on one side of the serial SR 310-3 and an adjacent bit of a serial SR on an opposite side of the serial SR 310-3 satisfying an exclusive-OR (XOR) relationship. For example, bit 0 of the serial SR 310-2 (the adjacent bit of the serial SR 310-2, which is on one side of the serial SR 310-3) is in the "1" state, and bit 3 of the serial SR 310-4 (the adjacent bit of the serial SR 310-4, which is on the opposite side of the serial SR 310-3) is in the "0" state. The states of the bit 0 of the serial SR 310-2 and the bit 3 of the serial SR 310-4 thus satisfy the XOR relationship, and serial SR 310-3 may be enabled for the current cycle.

Figure 4:
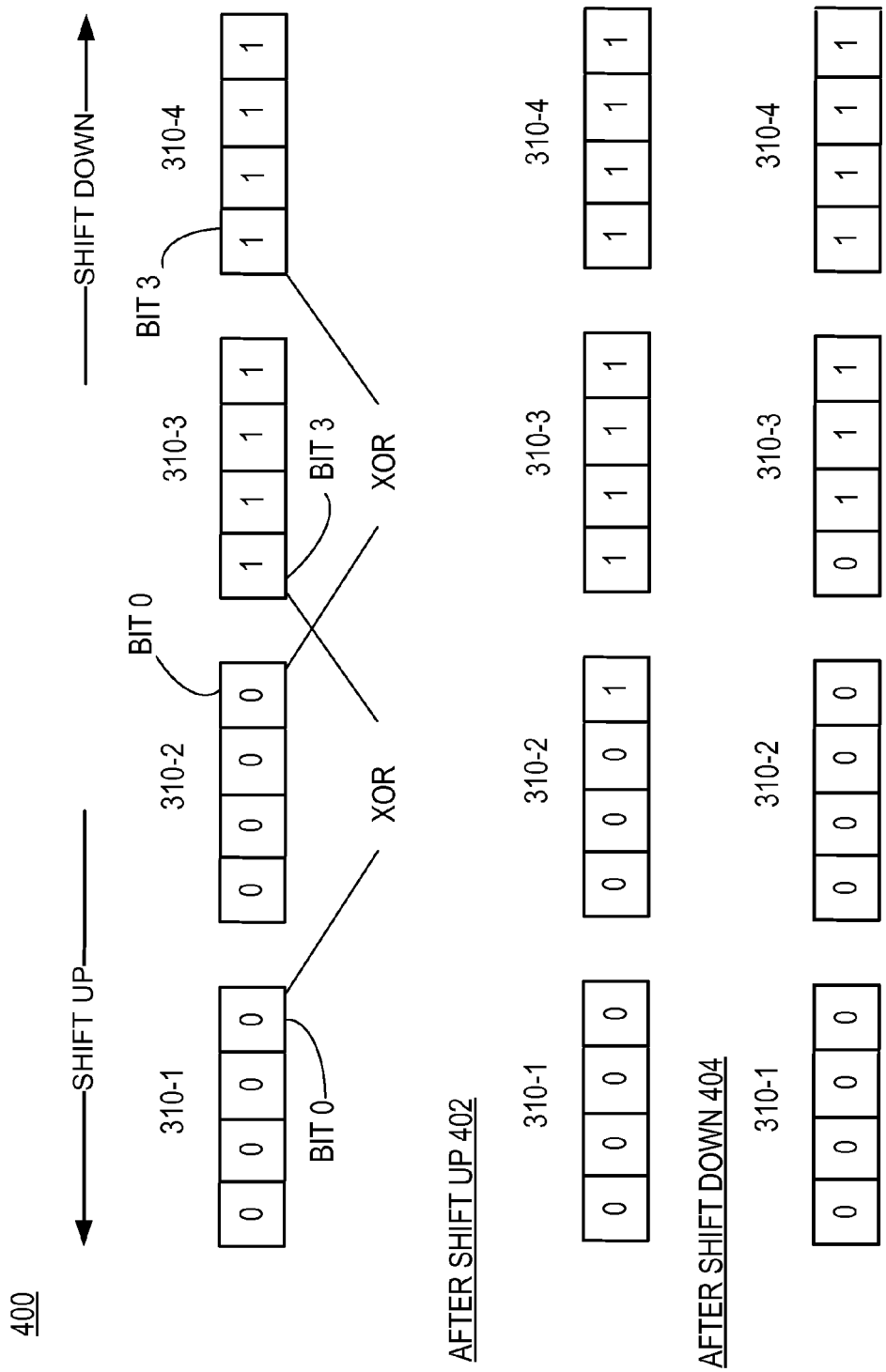
FIG. 4 is a conceptual representation of diagrams illustrating other states of an exemplary embodiment of a thermometer code converter.

FIG. 4 is a conceptual representation of diagrams 400, 402, and 404 illustrating other states of an exemplary embodiment of a thermometer code converter. Diagram 402 illustrates the state of the thermometer code converter after shifting up from diagram 400. Diagram 404 illustrates the state of the thermometer code converter after shifting down from diagram 400. As shown, the states of the serial SRs 310-1 and 310-4 are unchanged by a shift from the states of diagram 400.

The states of the serial SRs 310-2 and 310-3 may change due to a shift (diagrams 402 and 404, respectively), and therefore, the serial SRs 310-2 and 310-3 may be enabled for a shift in a current cycle. The states of the serial SRs 310-1 and 310-4 will not change in the current cycle, and therefore, these serial SRs may be deactivated or disabled to reduce power consumption. The condition to enable the serial SR 310-3 may be based on the current states (diagram 400) of an adjacent bit of a serial SR on one side of the serial SR 310-3 and an adjacent bit of a serial SR on an opposite side of the serial SR 310-3 satisfying the XOR relationship. For example, bit 0 of the serial SR 310-2 (the adjacent bit of the serial SR 310-2, which is on one side of the serial SR 310-3) is in the "1" state, and bit 3 of the serial SR 310-4 (the adjacent bit of the serial SR 310-4, which is on the opposite side of the serial SR 310-3) is in the "0" state. The states of the bit 0 of the serial SR 310-2 and the bit 3 of the serial SR 310-4 thus satisfy the XOR relationship, and serial SR 310-3 may be enabled for the current cycle.

Likewise, the condition to enable the serial SR 310-2 may be based on the current states (diagram 400) of an adjacent bit of a serial SR on one side of the serial SR 310-2 and an adjacent bit of a serial SR on an opposite side of the serial SR 310-2 satisfying the XOR relationship. For example, bit 0 of the serial SR 310-1 (the adjacent bit of the serial SR 310-1, which is on one side of the serial SR 310-2) is in the "0" state, and bit 3 of the serial SR 310-3 (the adjacent bit of the serial SR 310-3, which is on the opposite side of the serial SR 310-2) is in the "1" state. The states of the bit 0 of the serial SR 310-1 and the bit 3 of the serial SR 310-3 thus satisfy the XOR relationship, and serial SR 310-2 may be enabled for the current cycle.

FIG. 5 is a conceptual representation of diagrams 500 and 502 illustrating further states of an exemplary embodiment of a thermometer code converter. In the examples, boundary states are presented. In diagram 500, the serial SRs 310-1 and 310-2 may be enabled. The enablement of the serial SR 310-2 follows the process describes in FIGS. 3 and 4 and is thus not repeated here. In case of a shift-up, the state of the serial SR 310-1 may change (e.g., bit 0 of the serial SR 310-1 may be shifted to "1") and therefore, the serial SR 310-1 may be enabled for the operation. The condition to enable the serial SR 310-2 may be based on the current state of an adjacent bit of a serial SR on one side of the serial SR 310-1 only. In this example, the adjacent bit of a serial SR on one side of the serial SR 310-1 (e.g., bit 3 of the serial SR 310-2) is in "1" state, which causes the enabling of the serial SR 310-2. In an exemplary embodiment, such enablement scheme may be viewed as the adjacent bit of a serial SR on one side of the serial SR 310-1 (e.g., bit 3 of the serial SR 310-2) being in an XOR relationship with a "0" state (e.g., a virtual adjacent bit of a serial SR on an opposite side of the serial SR 310-1, which is always in the "0" state).

In diagram 502, the serial SRs 310-3 and 310-4 may be enabled. The enablement of the serial SR 310-3 follows the process describes in FIGS. 3 and 4 and is thus not repeated here. In case of a shift-down, the state of the serial SR 310-4 may change (e.g., bit 3 of the serial SR 310-1 may be shifted to "0"), and therefore, the serial SR 310-4 may be enabled for the operation. The condition to enable the serial SR 310-4 may be based on the current state of an adjacent bit of a serial SR on one side of the serial SR 310-4. In this example, the adjacent bit of a serial SR on one side of the serial SR 310-4 (e.g., bit 0 of the serial SR 310-3) is in "0" state, which causes the enabling of the serial SR 310-4. In an exemplary embodiment, such enablement scheme may be viewed as the adjacent bit of a serial SR on one side of the serial SR 310-4 (e.g., bit 0 of the serial SR 310-3) being in an XOR relationship with a "1" state (e.g., a virtual adjacent bit of a serial SR on an opposite side of the serial SR 310-4, which is always in the "1" state).

FIG. 6 is a block diagram of an exemplary embodiment of a thermometer code converter 600. The thermometer code converter 600 includes multiple serial SRs (310-1, 310-2, 310-3, 310-4) arranged to convert the binary value input 112 to a thermometer code output 122. The multiple serial SRs (310-1, 310-2, 310-3, 310-4) are arranged in series. For example, for a shift up operation (SU), the serial SR 310-4 shifts to 310-3; the serial SR 310-3 shifts to 310-2, and so forth. For a shift down operation (SD), the serial SR 310-1 shifts to 310-2; the serial SR 310-2 shifts to 310-3, and so forth.

Each of the serial SRs (310-1, 310-2, 310-3, 310-4) is controlled by a corresponding clock control circuit (610-1, 610-2, 610-3, 610-4). The clock control circuits 610-1, 610-2, 610-3, and 610-4 provide the means for enabling a subset (e.g., less than all) of the serial SRs (310-1, 310-2, 310-3, 310-4). In this example, each of the clock control circuits 610-1, 610-2, 610-3, 610-4 may receive a master clock and selectively enable a corresponding serial SR (310-1, 310-2, 310-3, 310-4) by generating a clock (clock-1 for enabling the serial SR 310-1, clock-2 for enabling the serial SR 310-2, and so forth). Each of the clock control circuit may generate a clock to enable the corresponding serial SR based on the master clock and input from adjacent serial SRs in manner to be described later.

The clock control circuits 610-1, 610-2, 610-3, and 610-4 may be configured to enable at most two of the serial SRs (310-1, 310-2, 310-3, 310-4). See, e.g., FIGS. 3-5 and the associated descriptions. For example, diagrams 400, 500, and 502 illustrate the states in which only two of serial SRs (310-1, 310-2, 310-3, 310-4) may be enabled.

In an exemplary embodiment, the thermometer code converter 600 may further include a compare circuit 621 and a counter 620. A state of the counter 620 may correspond to a current binary state of the thermometer code converter 600. The compare circuit 621 receives binary value 112 and compares it with the current state of the counter 620 (e.g., the current binary state of the thermometer code converter 600) and generates a shift-up (SU) or a shift-down (SD) signal. In the exemplary embodiment, the compare circuit 621 may be a digital comparator. In a case that the binary value 112 equals to a current binary state of the thermometer code converter 600, the compare circuit 621 may output neither SU nor SD. In such case, because the serial SRs (310-1, 310-2, 310-3, 310-4) do not shift in the current cycle, all of the serial SRs (310-1, 310-2, 310-3, 310-4) may be disabled to further reduce power consumption.

The SU signal causes the serial SRs (310-1, 310-2, 310-3, 310-4) to shift up when the binary value 112 exceeds the state of the counter 620 and the SD signal causes the serial SRs (310-1, 310-2, 310-3, 310-4) to shift down when the binary value 112 does not exceed the state of the counter 620. The polarities of the shifts caused by the SU and SD signals may be reversed based on the particular application. The SU and SD signals may be feedback to the counter 620 to increment or to decrement the state of the counter 620 for a subsequent cycle.

Figure 7A:
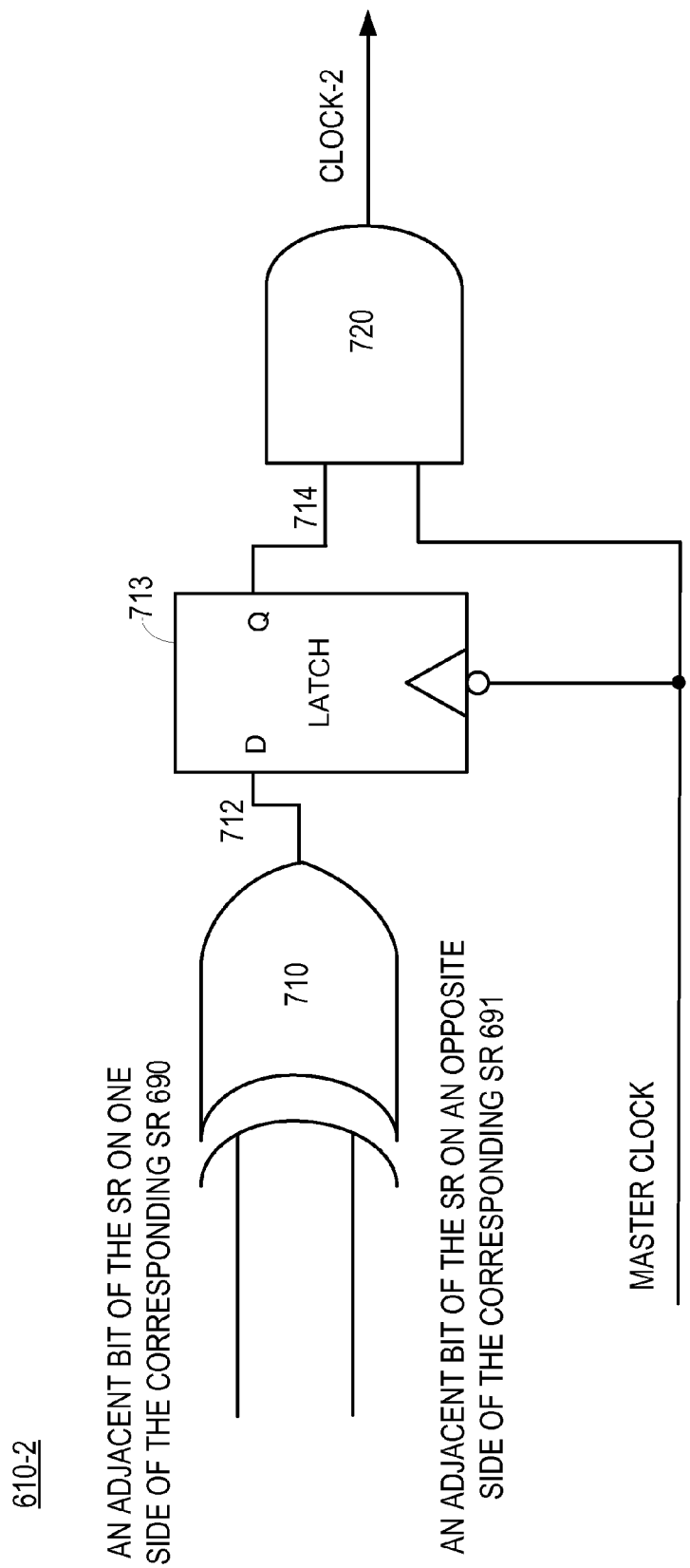
FIG. 7A is a diagram of an exemplary embodiment of a clock control circuit.
Figure 7B:
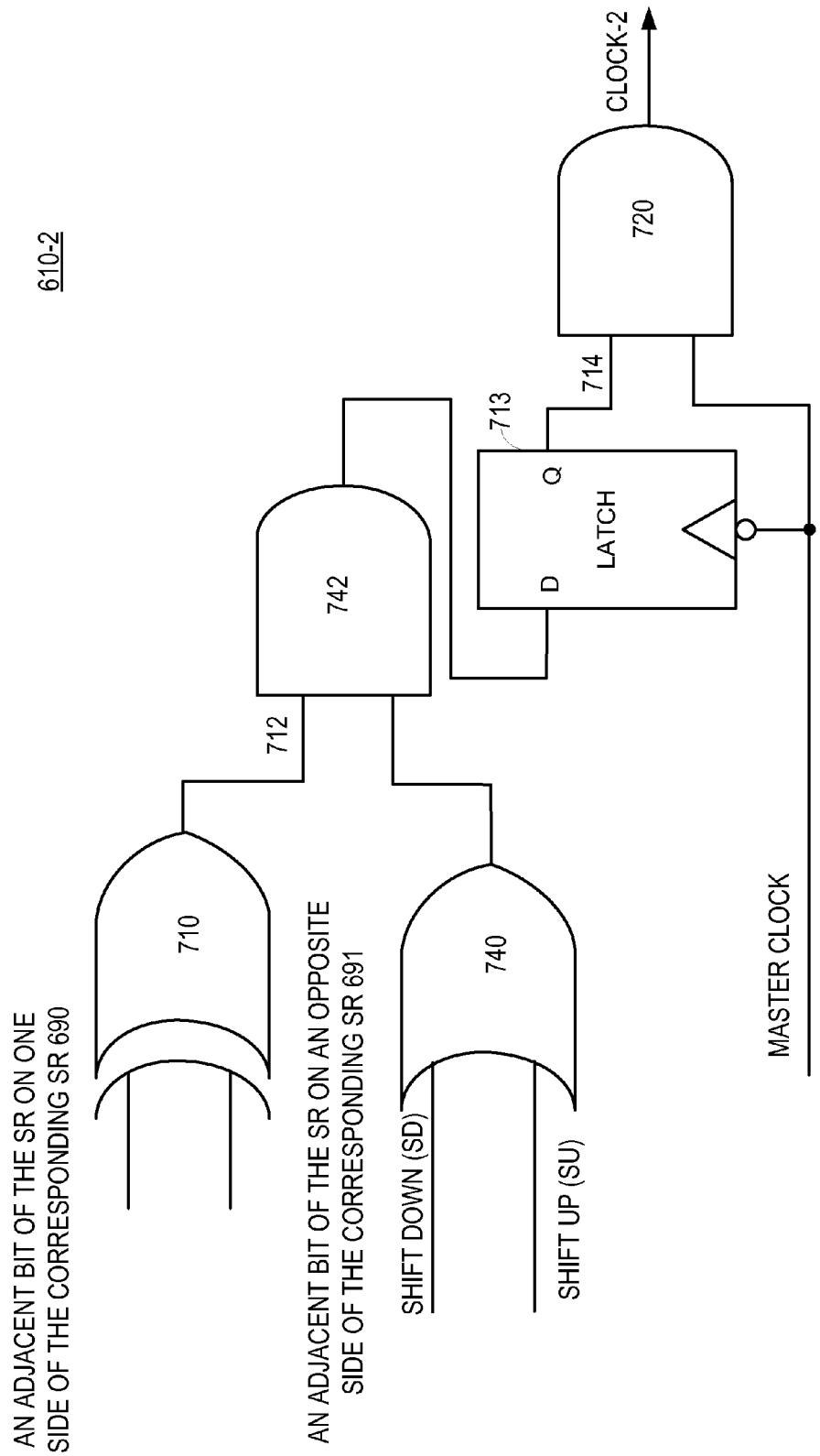
FIG. 7B is a diagram of another exemplary embodiment of a clock control circuit.

Each of the clock control circuits (610-1-610-4) may include a gate or gates (e.g., logic gates) configured to enable the clock (CLOCK-1-CLOCK 4) provided to corresponding one of the serial SRs (310-1, 310-2, 310-3, 310-4). The gate or gates may be configured to enable the corresponding one of the serial SRs (e.g., SR 310-2) based on an adjacent bit of the shift register on one side of the one of the shift registers (e.g., SR 310-1) and an adjacent bit of the shift register on an opposite side of the one of the shift registers (e.g., SR 310-3). Further details are provided with FIGS. 7A and 7B presented below. In the exemplary embodiment, the gate or gates are configured to perform an XOR function of the adjacent bit of the shift register on one side of the one of the shift registers (e.g., SR 310-1) and the adjacent bit of the shift register on an opposite side of the one of the shift registers (e.g., SR 310-3). However, as will be understood be a person or ordinary skill in the art, logic functions other than the XOR function may be utilized to enable the clock (CLOCK-2). Moreover, the XOR function may be implemented using XOR gate(s), OR gate(s), AND gate(s), complex logic, or other suitable logics, as is known in the art.

FIG. 7A is a diagram of an exemplary embodiment of a clock control circuit 610-2. The clock control circuits 610-1, 610-3, 610-4 may have similar structure. The clock control circuit 610-2 is configured to generate the clock-2 for enabling the corresponding serial SR 310-2. In an exemplary embodiment, the clock control circuit 610-2 includes an XOR gate 710, a level-sensitive latch 713, and an AND gate 720. As provide above, although an XOR gate is depicted, the XOR function may be implemented using different logic gates (e.g., OR gates and AND gates) and other circuits. The XOR gate 710 receives and XORs an adjacent bit of the SR on one side of the corresponding serial SR 310-2 690 (e.g., bit 0 of the serial SR 310-1) and an adjacent bit of the SR on an opposite side of the corresponding serial SR 310-2 691 (e.g., bit 3 of the serial SR 310-3). The XOR gate outputs 712 to the level-sensitive latch 713, which is enabled by the master clock. The level-sensitive latch 713 operates to prevent glitches in the clock-2. For example, glitches on the output 712 cannot pass through the level-sensitive latch 713 and onto the clock-2. The level-sensitive latch 713 provides output 714 to the AND gate 720. The AND gate 720 gates the master clock with the output 714 to selectively generate the clock-2 and to selectively enable the serial SR 310-2. FIG. 7A provides one configuration for gating the clocks, and, as would be understood by a person of ordinary skill in the art, there are other schemes for clock gating. Some examples of additional clock gating schemes are provided in FIG. 7B.

FIG. 7B is a diagram of another exemplary embodiment of a clock control circuit 610-2. The clock control circuits 610-1, 610-3, 610-4 may have similar structures. In this exemplary embodiment, the output 712 of the XOR gate 710 is further gated with the signals SD and SU via an OR gate 740 and an AND gate 742. In this fashion, the clock-2 may remain unchanged when the serial SRs are not being shifted.

An optimal number of the serial SRs N may be calculated as follows. A switching power consumed for one of the serial SR is:

$$2^K_N \times (P_{FF}^{switch}) + N \times (P_{Gate}^{switch}),$$

where K is the number of bits in the thermometer code output 122, N is the number of the serial SRs, $P_{FF}^{switch}$ is the switching power consumed for a flip-flip in the switching serial SR (e.g., 310-2), and $P_{Gate}^{switch}$ is the switching power consumed for a gate of the clock control circuits (e.g., the AND gate 720 and the level-sensitive latch 713 of the clock control circuit 610-2). An optimal N (for a minimum switching power) may be obtained as:

$$N = \sqrt{\frac{2^K \times P_{FF}^{switch}}{P_{Gate}^{switch}}}.$$

Figure 8:
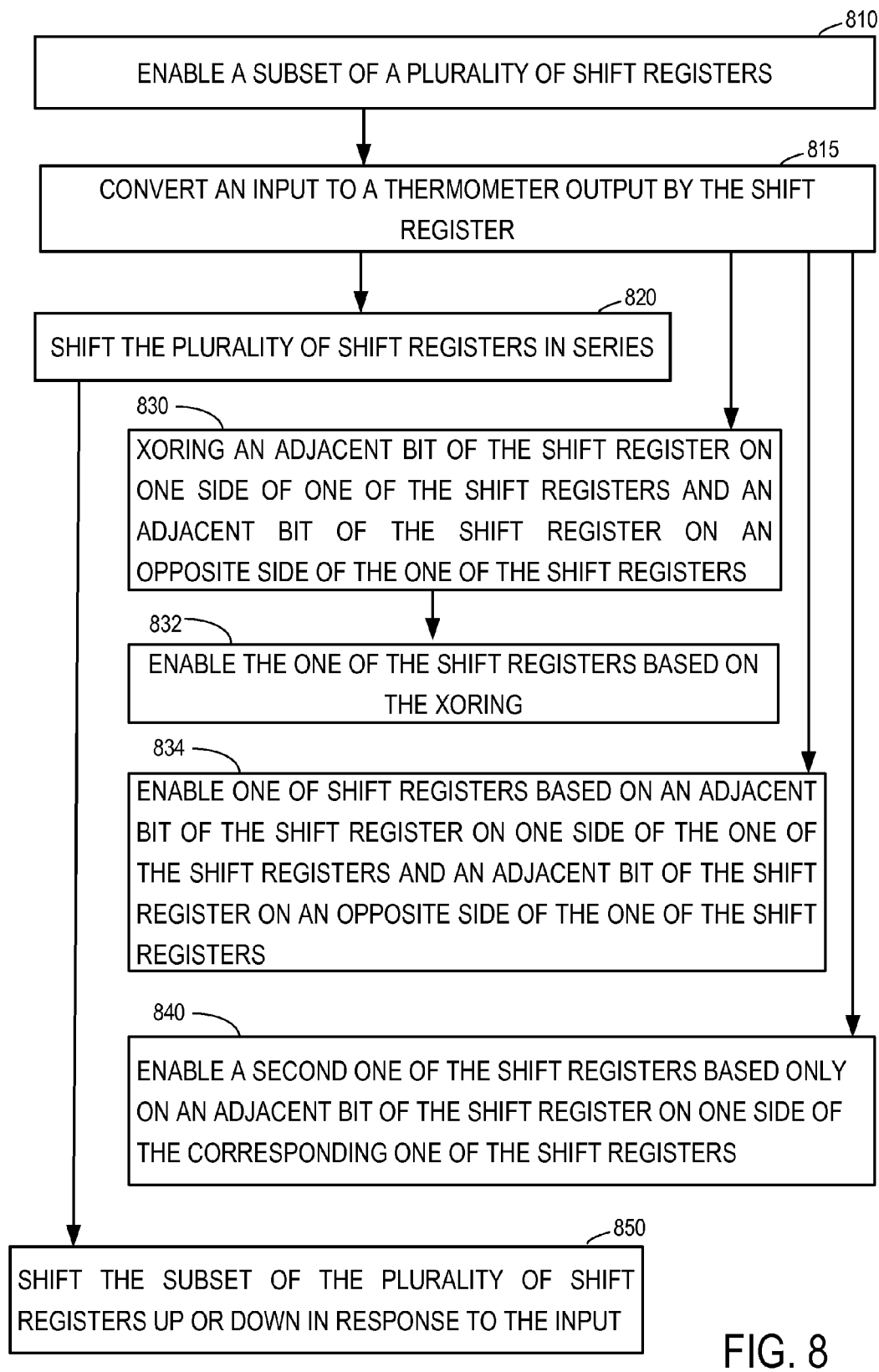
FIG. 8 is a flow chart of operating an exemplary embodiment of a thermometer code converter.

FIG. 8 is a flow chart of operating an exemplary embodiment of a thermometer code converter 600. Referring to FIGS. 3-7 and the accompanying text, at 810, a subset of a plurality of shift registers is enabled. For example, FIG. 6 illustrates that the thermometer code converter 600 includes multiple serial SRs (310-1, 310-2, 310-3, 310-4). A subset (e.g., less than all) of the multiple serial SRs may be enabled. For example, diagrams 400, 500, and 502 illustrate the states in which (at most) only two of serial SRs (310-1, 310-2, 310-3, 310-4) may be enabled.

At 815, an input is converted to a thermometer output by the shift registers. Examples of this step are provided in FIGS. 4-6, 7A, and 7B and the accompanying text. At 820, the shift register are shifted in series. For example, as discussed with FIG. 6, the multiple serial SRs (310-1, 310-2, 310-3, 310-4) may be shifted up or shifted down (e.g., logically) as controlled by the compare circuit 621. Physically, the shifting up and the shifting down may be performed by the enabled subset of the plurality of shift registers.

At 830, an adjacent bit of the shift register on one side of one of the shift registers and an adjacent bit of the shift register on an opposite side of the one of the shift registers are XORed. For example, FIG. 3 illustrates that the state of the serial SR 310-3 may change due to a shift, and therefore, the serial SR 310-3 may be enabled for a shift in a current cycle. The states of the serial SRs 310-1, 310-2, and 310-4 will not change in the current cycle, and therefore, these serial SRs may be deactivated or disabled to reduce power consumption. The condition to enable the serial SR 310-3 may be based on the states that an adjacent bit of a serial SR on one side of the serial SR 310-3 and an adjacent bit of a serial SR on an opposite side of the serial SR 310-3 satisfying an exclusive-OR (XOR) relationship. For example, bit 0 of the serial SR 310-2 (the adjacent bit of the serial SR 310-2, which is on one side of the serial SR 310-3) is in the "1" state, and bit 3 of the serial SR 310-4 (the adjacent bit of the serial SR 310-4, which is on the opposite side of the serial SR 310-3) is in the "0"

state. The states of the bit 0 of the serial SR 310-2 and the bit 3 of the serial SR 310-4 thus satisfy the XOR relationship, and serial SR 310-3 may be enabled for the current cycle. In one example, referring to FIG. 7A, the XOR gate 710 performs the XOR function. At 832, the one of the shift registers is enabled based on the XORing. For example, referring to FIG. 7A, the serial SR 310-2 is enabled by the CLOCK-2, which is generated based on the result (e.g., output) of the XOR gate 710.

At 834, one of the shift registers is enabled based on an adjacent bit of the shift register on one side of the one of the shift registers and an adjacent bit of the shift register on an opposite side of the one of the shift registers. For example, referring to FIG. 7A, the serial SR 310-2 is enabled by the CLOCK-2, which is generated based on XORing (e.g., by the XOR gate 710) an adjacent bit of the shift register on one side of the one of the shift registers (e.g., SR 310-1) and an adjacent bit of the shift register on an opposite side of the one of the shift registers (e.g., 310-3).

At 840, a second one of the shift registers is enabled based only on an adjacent bit of the shift register on one side of said corresponding one of the shift registers. For example, FIG. 5 provides that in case of a shift-up, the state of the serial SR 310-1 may change (e.g., bit 0 of the serial SR 310-1 may be shifted to "1") and therefore, the serial SR 310-1 may be enabled for the operation. The condition to enable the serial SR 310-2 may be based on the current state of an adjacent bit of a serial SR on one side of the serial SR 310-1 only. In this example, the adjacent bit of a serial SR on one side of the serial SR 310-1 (e.g., bit 3 of the serial SR 310-2) is in "1" state, which causes the enabling of the serial SR 310-2. In an exemplary embodiment, such enablement scheme may be viewed as the adjacent bit of a serial SR on one side of the serial SR 310-1 (e.g., bit 3 of the serial SR 310-2) being in an XOR relationship with a "0" state (e.g., a virtual adjacent bit of a serial SR on an opposite side of the serial SR 310-1, which is always in the "0" state).

At 850, the subset of the plurality of shift registers shifts up or down in response to the input. For example, FIG. 6 illustrates that the thermometer code converter 600 may further include a compare circuit 621 and a counter 620. The state of the counter 620 may correspond to a current binary state of the thermometer code converter. The compare circuit 621 receives binary value 112 and compares it with the current state of the thermometer code converter 600 stored on the counter 620 and generates a shift-up control (SU) or a shift-down control (SD). In a case that the binary value 112 equals to a current state of the thermometer code converter 600 stored on the counter 620, the compare circuit 621 may output neither SU nor SD. The SU signal causes the serial SRs (310-1, 310-2, 310-3, 310-4) to shift up, and the SD signal causes the serial SRs (310-1, 310-2, 310-3, 310-4) to shift down. The SU and SD signals may be feedback to the counter 620 to increment or decrement the stored state for a subsequent cycle.

Moreover, the exemplary embodiments presented above provide the means for each of the steps of the flow chart of FIG. 8. For example, the clock control circuit (610-1, 610-2, 610-3, 610-4) may provide means for enabling a subset of a plurality of shift registers (e.g., serial SRs 310-1, 310-2, 310-3, 310-4). The compare circuit generating the SU and SD signals may provide the means (along with SRs 310-1-310-4) for converting an input to a thermometer output by the plurality of shift registers.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A code converter, comprising:
   a plurality of serial shift registers arranged to convert an input to a thermometer output; and
   a plurality of clock control circuits each configured to provide a clock to a corresponding one of the shift registers, wherein
   each of the shift registers is configured to selectively shift up or shift down in response to the input.

2. The code converter of claim 1, wherein the shift registers are arranged in series.

3. A code converter, comprising:
   a plurality of serial shift registers arranged to convert an input to a thermometer output; and
   a plurality of clock control circuits each configured to provide a clock to a corresponding one of the shift registers,
   wherein the shift registers are arranged in series, and
   wherein one of the clock control circuits comprises a gate or gates configured to enable the clock provided to its corresponding one of the shift registers.

4. The code converter of claim 3, wherein the gate or gates of the one clock control circuit is configured to enable the clock provided to its corresponding one of the shift registers based on an adjacent bit of the shift register on one side of the corresponding one of the shift registers and an adjacent bit of the shift register on an opposite side of the corresponding one of the shift registers.

5. The code converter of claim 3, wherein the gate or gates of the one clock control circuit is configured to
   XOR an adjacent bit of the shift register on one side of the corresponding one of the shift registers and an adjacent bit of the shift register on an opposite side of the corresponding one of the shift registers, and
   enable the clock provided to its corresponding one of the shift registers by based on a result of the XORing.

6. The code converter of claim 3, wherein a gate or gates of a second one of the clock control circuits is configured to enable the clock provided to its corresponding one of the shift registers based only on an adjacent bit of the shift register on one side of the corresponding one of the shift registers.

7. The code converter of claim 1, wherein the clock control circuits are configured to enable at most two of the shift registers in a cycle.

8. The code converter of claim 1, wherein the clock control circuits are configured to disable the shift registers in response to the input.

9. A method of generating a signal in thermometer code, comprising:
enabling a subset of a plurality of shift registers; and
converting an input to a thermometer output by the shift registers, wherein
the converting the input to the thermometer output by the shift registers comprises shifting the shift register in series, and
shifting the subset of the plurality of shift registers up or down in response to the input.

10. The method of claim 9, wherein the enabling the subset of the plurality of shift registers comprises
XORing an adjacent bit of the shift register on one side of one of the shift registers and an adjacent bit of the shift register on an opposite side of the one of the shift registers, and
enabling the one of the shift registers based on the XORing.

11. The method of claim 9, wherein the enabling the subset of the plurality of shift registers comprises enabling one of the shift registers based on an adjacent bit of the shift register on one side of the one of the shift registers and an adjacent bit of the shift register on an opposite side of the one of the shift registers.

12. The method of claim 9, wherein the enabling the subset of the plurality of shift registers further comprises enabling a second one of the shift registers based only on an adjacent bit of the shift register on one side of the second one of the shift registers.

13. The method of claim 9, wherein the subset of the plurality of shift registers comprises at most two of the plurality of shift registers in a cycle.

14. A code converter, comprising:
means for converting an input to a thermometer output, wherein the means for converting comprises a plurality of shift registers; and
means for enabling a subset of the shift registers, wherein the means for converting is configured to convert the input to the thermometer output by shifting the subset of the plurality of shift registers up or down in response to the input.

15. The code converter of claim 14, wherein the means for converting is configured to convert the input to the thermometer output by shifting the shift registers in series.

16. The code converter of claim 15, wherein the means for enabling is configured to
XOR an adjacent bit of the shift register on one side of one of the shift registers and an adjacent bit of the shift register on an opposite side of the one of the shift registers, and
enable the one of the shift registers based a result of the XORing.

17. The code converter of claim 15, wherein the means for enabling is configured to enable one of the shift registers based an adjacent bit of the shift register on one side of the one of the shift registers and an adjacent bit of the shift register on an opposite side of the one of the shift registers.

18. The code converter of claim 15, wherein the means for enabling is further configured to enable a second one of the shift registers based only on an adjacent bit of the shift register on one side of the second one of the shift registers.

19. The code converter of claim 15, wherein the subset of the plurality of shift registers comprises at most two of the shift registers in a cycle.

20. The code converter of claim 1, wherein each of the plurality of clock control circuits is configured to selective provide a clock to a corresponding one of the shift registers to disable at least one of the shift registers.

* * * * *